US010777605B2

(12) United States Patent
Freedman et al.

(10) Patent No.: US 10,777,605 B2
(45) Date of Patent: Sep. 15, 2020

(54) QUANTUM COMPUTING DEVICES WITH MAJORANA HEXON QUBITS

(71) Applicant: Microsoft Technology Licensing, LLC, Redmond, WA (US)

(72) Inventors: Michael Freedman, Santa Barbara, CA (US); Chetan Nayak, Santa Barbara, CA (US); Roman Lutchyn, Santa Barbara, CA (US); Torsten Karzig, Goleta, CA (US); Parsa Bonderson, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/680,192

(22) Filed: Nov. 11, 2019

(65) Prior Publication Data

US 2020/0098821 A1    Mar. 26, 2020

Related U.S. Application Data

(60) Division of application No. 15/636,376, filed on Jun. 28, 2017, now Pat. No. 10,490,600, which is a continuation-in-part of application No. 15/634,983, filed on Jun. 27, 2017, now Pat. No. 10,635,988.

(60) Provisional application No. 62/376,386, filed on Aug. 17, 2016, provisional application No. 62/378,218, filed on Aug. 23, 2016, provisional application No. 62/382,253, filed on Aug. 31, 2016.

(51) Int. Cl.
*H01L 27/18* (2006.01)
*G06N 10/00* (2019.01)
*H01L 39/22* (2006.01)
*B82Y 10/00* (2011.01)

(52) U.S. Cl.
CPC ............. *H01L 27/18* (2013.01); *G06N 10/00* (2019.01); *H01L 39/228* (2013.01); *B82Y 10/00* (2013.01)

(58) Field of Classification Search
CPC ....... H01L 27/18; H01L 39/228; G06N 10/00; G06N 99/002; B82Y 10/00
See application file for complete search history.

(56) References Cited

U.S. PATENT DOCUMENTS 3,578,968 A * 5/1971 Hellwig ................... H05H 3/00
                                                              250/251
8,209,279 B2 * 6/2012 Freedman .............. B82Y 10/00
                                                              706/62

(Continued)

*Primary Examiner* — Scott B Geyer
(74) *Attorney, Agent, or Firm* — Klarquist Sparkman, LLP

(57) ABSTRACT

Various embodiments of a modular unit for a topologic qubit and of scalable quantum computing architectures using such modular units are disclosed herein. For example, one example embodiment is a modular unit for a topological obit comprising 6 Majorana zero modes (MZMs) on a mesoscopic superconducting island. These units can provide the computational MZMs with protection from quasiparticle poisoning. Several possible realizations of these modular units are described herein. Also disclosed herein are example designs for scalable quantum computing, architectures comprising the modular units together with gates and reference arms (e.g., quantum dots, Majorana wires, etc.) configured to enable joint parity measurements to be performed for various combinations of two or four MZMs associated with one or two modular units, as well as other operations on the states of MZMs.

9 Claims, 11 Drawing Sheets

(56) References Cited

U.S. PATENT DOCUMENTS

| | | | | |
|---|---|---|---|---|
| 8,583,903 | B2* | 11/2013 | Freedman | G06N 10/00 |
| | | | | 712/221 |
| 8,620,855 | B2* | 12/2013 | Bonderson | G06N 10/00 |
| | | | | 706/62 |
| 9,256,834 | B2* | 2/2016 | Bonderson | G06N 10/00 |
| 2012/0112168 | A1* | 5/2012 | Bonderson | B82Y 10/00 |
| | | | | 257/31 |
| 2014/0050475 | A1* | 2/2014 | Bonderson | G06N 10/00 |
| | | | | 398/45 |
| 2014/0214257 | A1* | 7/2014 | Williams | G06F 1/20 |
| | | | | 701/25 |
| 2014/0221059 | A1* | 8/2014 | Freedman | H01L 39/228 |
| | | | | 455/899 |
| 2014/0279822 | A1* | 9/2014 | Bonderson | B82Y 10/00 |
| | | | | 706/62 |
| 2017/0091649 | A1* | 3/2017 | Clarke | G06N 10/00 |
| 2017/0141287 | A1* | 5/2017 | Barkeshli | H01L 39/223 |
| 2018/0052806 | A1* | 2/2018 | Hastings | G06N 10/00 |
| 2018/0053113 | A1* | 2/2018 | Lutchyn | H01L 27/18 |
| 2019/0220769 | A1 | 7/2019 | Pikulin | |

* cited by examiner

QUANTUM COMPUTING DEVICES WITH MAJORANA HEXON QUBITS

CROSS REFERENCE TO RELATED APPLICATIONS

This application is a divisional of U.S. Nonprovisional application Ser. No. 15/636,376, entitled "QUANTUM COMPUTING DEVICES WITH MAJORANA HEXON QUBITS" filed on Jun. 28, 2017, which claims the benefit of U.S. Provisional Application No. 62/376,386, entitled "MEASURING AND MANIPULATING MAJORANA QUASIPARTICLE STATES USING THE STARK EFFECT" filed on Aug. 17, 2016, and U.S. Provisional Application No. 62/378,218, entitled "MEASURING AND MANIPULATING STATES OF NON-ABELIAN QUASI-PARTICLES VIA QUANTUM DOT HYBRIDIZATION ENERGY SHIFTS" filed on Aug. 23, 2016; and U.S. Provisional Application No. 62/382,253, entitled "QUANTUM COMPUTING DEVICES WITH MAJORANA HEXON QUBITS" filed on Aug. 31, 2016, all of which are hereby incorporated herein by reference in their entirety.

This application is a divisional of U.S. Nonprovisional application Ser. No. 15/636,376, entitled "QUANTUM COMPUTING DEVICES WITH MAJORANA HEXON QUBITS" filed on Jun. 28, 2017, which is also a continuation in part of U.S. Nonprovisional application Ser. No. 15/634,983, entitled "MEASURING AND MANIPULATING STATES OF NON-ABELIAN QUASIPARTICLES VIA QUANTUM DOT HYBRIDIZATION ENERGY SHIFTS" filed on Jun. 27, 2017, which is hereby incorporated herein by reference in its entirety.

FIELD

This application relates generally to quantum computers. More specifically, the application concerns topologically protected quantum circuits.

SUMMARY

Various embodiments of a modular unit for a topologic qubit and of scalable quantum computing architectures using such modular units are disclosed herein. For example, one example embodiment is a modular unit for a topological quint comprising six Majorana zero modes (MZMs) on a mesoscopic superconducting island. These units can provide the computational MZMs with protection from quasiparticle poisoning. Several possible realizations of these modular units are described herein. Also disclosed herein are example designs for scalable quantum computing architectures comprising the modular units together with gates and reference arms (e.g., quantum dots, Majorana wires, etc.) configured to enable joint parity measurements to be performed for various combinations of two or four MZMs associated with one or two modular units, as well as other operations on the states of MZMs.

DETAILED DESCRIPTION

I. General Considerations

Figure 1:
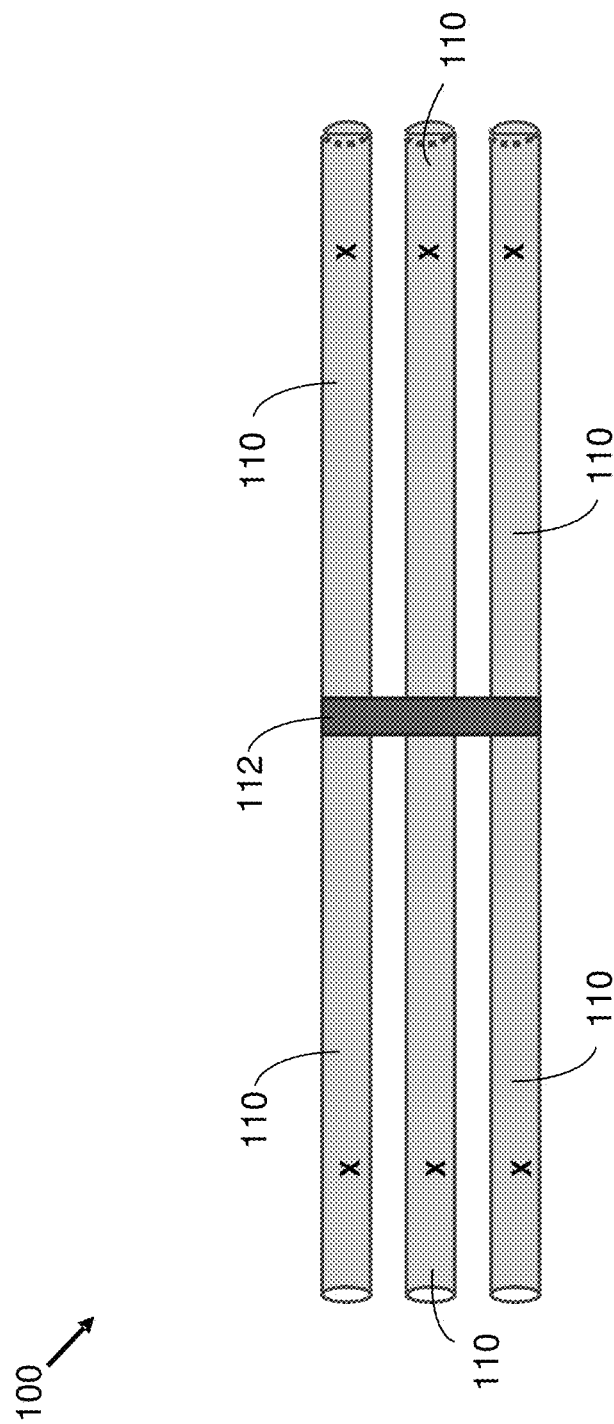
FIG. 1 is a schematic block diagram of an example two-sided Majorana Hexon qubit.

Disclosed herein are representative embodiments of methods, apparatus, and systems for topological quantum devices, and in particular for topologic qubits as can be used in a topological quantum computer. The disclosed methods, apparatus, and systems should not be construed as limiting in any way. Instead present disclosure is directed toward all novel and nonobvious features and aspects of the various disclosed embodiments, alone or in various combinations and subcombinations with one another. Furthermore, any features or aspects of the disclosed embodiments can be used alone or in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Various alternatives to the examples described herein are possible. For example, some of the methods described herein can be altered by changing the ordering of the method acts described, by splitting, repeating, or omitting certain method acts, etc. The various aspects of the disclosed technology can be used in combination or separately. Different embodiments use one or more of the described innovations. Some of the innovations described herein address one or more of the problems noted herein. Typically, a given technique/tool does not solve all such problems.

As used in this application and in the claims, the singular forms "a," "an," and "the" include the plural forms unless the context clearly dictates otherwise. Additionally, the term "includes" means "comprises." Further, as used herein, the term "and/or" means any one item or combination of any items in the phrase.

II. Overview of Disclosed Technology

Various embodiments of a modular unit for a topologic qubit and of scalable quantum computing architectures using such modular units are disclosed herein. For example, one example embodiment is a modular unit for a topological qubit comprising six Majorana zero modes (MZMs) on a mesoscopic superconducting island. Such a modular unit is sometimes referred to herein as "Majorana Hexon qubit." These units can provide the computational MZMs with protection from quasiparticle poisoning. Several possible realizations of these modular units are described herein. Also disclosed herein are example designs for scalable quantum computing architectures comprising the modular units together with gates and reference arms (e.g., quantum dots, Majorana wires, etc.) configured to enable joint parity measurements to be performed for various combinations of two or four MZMs associated with one or two modular units, as well as other operations on the states of MZMs. These can be configured in such a way to allow the generation of all the Clifford gates with topological protection and non-Clifford gates (e.g., phase gate) without topological protection, thereby producing a computationally universal gate set. Several possible realizations of these architectures are disclosed.

While the figures depict realizations of MZMs at the endpoints of nanowires, the principles of the disclosed technology can also apply to more general realizations of MZMs (e.g., 2DEGs) and are not specifically limited to nanowire realizations.

Further, while the example embodiments discussed below focus on six MZMs per superconducting island, larger numbers of MZMs per island are also possible and considered to be within the scope of the disclosed technology.

Certain example embodiments of the disclosed modular units lead to planar, two-dimensional, connected networks of qubits. Further, certain embodiments of the disclosed technology provide great flexibility in Hexon manipulations (via braiding, of Majoranas) through the presence of an extra ancilia. In further embodiments, the ancillas in the network are integrated (and shared between one or more Hexons) in such a manner that additional ancillas are not necessary. For instance, in some embodiments, each Hexon can be manipulated or entangled with other Hexons without the need of additional qubits that would act as ancillas.

Further examples and details concerning the disclosed technology, as well as other architectures with which the disclosed technology can be used, are described in T. Karzig et al., "Scalable Designs for Quasiparticle-Poisoning-Protected Topological Quantum Computation with Majorana Zero Modes," arXiv: 1610.05289 (March 2017) and T. Karzig et al "Scalable Designs for Quasiparticle-Poisoning-Protected Topological Quantum Computation with Majorana Zero Modes," Phys. Rev. B 95, 235305 (2017), both of which are hereby incorporated herein by reference.

These and other embodiments will be explained in more detail in the description below.

III. Example Majorana Hexon Qubits

One example embodiment disclosed herein is a modular unit comprising six or more MZMs situated on a single mesoscopic superconducting island. When the charging energy $E_c$ of the island is large, it provides the contained MZMs protection from quasiparticle poisoning.

Systems with MZMs are often referred to as "topological" or "topologically protected," hut, more precisely, they are "symmetry protected topological," as detailed in Phys. Rev. B 87, 195451 (2013) [arXiv: 1212.6395]. In particular, their topological protection is based on fermion parity symmetry, meaning the system's fermion parity must be preserved in order to manifest topological protection of the states encoded nonlocally in the MZMs. Consequently, MZM systems are potentially vulnerable to stray electrons entering MZMs from outside the system—a quasiparticle poisoning. Such events constitute errors for quantum information encoded in the (nonlocal) fermion parities of MZMs. In particular, they take qubits out of the computational subspace, since they flip the fermion parities associated with the MZMs. Hence, it is desirable to protect MZM systems used for quantum computation from quasiparticle poisoning.

Six is the smallest number of MZMs that supports the combination of one computational qubit (which is encoded in four of the MZMs) and one ancillary pair of MZMs. This combination is particularly useful because the presence of an ancillary pair makes it possible to generate braiding transformations using the "measurement-only" protocols detailed in U.S. Pat. No. 8,209,279: "Measurement-Only Topological Quantum Computation" and papers Phys. Rev. Lett. 101, 010501 (2008) [arXiv: 0802.0279] and Annals Phys. 324, 787-826 (2009) [arXiv: 0808.1933] or the tunable couplings methods, details of which can be found in e.g. Phys. Rev. B 87, 035113 (2013) [arXiv: 1210.7929] and Phys. Rev. B 88, 035121 (2013) [arXiv: 1303.4379]. In other words, one can perform sequences of topological charge (joint parity)measurements or sequences of tuning couplings, rather than physically transporting the MZMs in order to generate the braiding transformations on the qubit states encoded in MZMs. Thus, using the modular unit (a Majorana Hexon qubit) together with the ability to perform measurements of certain pairs of MZMs and/or the ability to control the tuning of couplings between the pairs of MZMs, one can generate the single-qubit Clifford gates with topological protection, while simultaneously protecting the qubit from quasiparticle poisoning errors.

The joint fermion parity measurements of MZMs play be implemented, for example, by conductance measurements, as described in Phys. Rev. Lett. 116, 050501 (2016) [arXiv: 1509.05345], or quantum dot spectroscopy, as described in U.S. Provisional Patent Application 62/378,218 and U.S. Provisional Patent Application 62/176,386. In this disclosure, the focus is primarily on measurement-only implementations of the braiding transformations, but it should be recognized that the braiding transformations can equivalently be performed by adiabatic evolution via changing Majorana couplings.

Spanning the full set of single-qubit Clifford gates on a given Majorana Hexon qubit (or the full set of braiding transformations for the non-ancillary MZMs on an island) involves a minimal set of pairs of MZMs upon which one can perform joint parity measurements. An efficient implementation follows from allowing measurements of each pair of MZMs within an island, though a subset of the pairs is sufficient. Practical constraints may limit or constrain which pairs can be measured.

Moreover, these modular units (Majorana Hexon qubits) are also compatible with generating entangling gates, e.g., two-qubit Clifford gates, while simultaneously protecting the qubits from quasiparticle poisoning, through the use of joint parity measurements of 4 MZMs (2 MZMs from one Majorana Hexon qubit unit and 2 from another). Together with the single qubit Clifford gates, these generate all (n-qubit) Clifford gates. More details on how such measurements generate the Clifford gates can be found in the "Appendix—Hexon Details" section below. It should be noted that, as long as one is able to perform the appropriate measurements of MZMs, one ancillary pair of MZMs on an island is sufficient for implementing entangling gates between two qubits on separate islands (between two Majorana Hexon qubits), without the need of extra ancillary MZMs, as detailed in the "Appendix—Hexon Details" section below.

It is known that the Clifford gates by themselves do not form a computationally universal gate set, but that supplementing the Clifford gates with a non-Clifford 1-qubit gate, e.g. the Π/8-phase gate yields a computationally universal gate set. Such a gate can be produced from "magic states" by using measurements. Magic states can be generated in a number of ways for Majorana systems. The apparatuses used to perform measurements and/or tune couplings of MZMs mentioned in this disclosure can be used to generate magic states. (These magic states will not be topologically protected, so they will likely require some error-correction, e.g. by magic state distillation methods of Phys. Rev. A 71, 022316 (2005) [quant-ph/0403025]; if desired, one can also utilize cancelation schemes, such as those detailed in Phys. Rev. X 6, 31019 (2016)[arXiv:1511.05161] to improve the fidelity of magic state generation, before distillation.) Example methods of generating magic states with the described apparatus include the partial interferometry methods detailed in U.S. Pat. No. 9,256,834: "Quantum Computers Having Partial Interferometric Quantum Gates" and the following discussion of performing measurements of non-Pauli operators.

The next sections described in more detail several possible architectures for realizing Majorana Hexon qubits in accordance with the disclosed technology.

IV. Two-Sided Majorana Hexon Qubit

In accordance with one example embodiment, the two-sided Majorana Hexon qubit comprises three one-dimensional topological superconductors (1DTSs) (e.g. half-shell Al-coated InAs nanowires) that are joined by a superconducting "backbone." For purposes of this discussion and without limitation, the horizontal direction is defined to be along the length of the 1DTSs and the vertical direction to be along the length of the backbone (perpendicular to the 1DTSs). The backbone effectively joins the three 1DTSs to form a single island. (The directional orientations used herein are for explanatory purposes, as the disclosed embodiments can be rotated into different orientations.)

FIG. 1 is a schematic block diagram 100 illustrating this configuration. In the figures, and in addition to the color coding, reference numbers or symbols are provided to designate the various components in accordance with the key at the bottom of each figure (e.g., s-wave superconductors 112, half-shell topological wires (or p-wave superconductors) 110, and Majorana zero mode (labelled some cases for ease of illustration, and usually with respect to the half-shell topological wire for P-wave superconductor) on which the MZMs reside, only a few examples of the components are highlighted by reference numbers even though additional instances of the component are illustrated in the figure. One skilled in the art will recognize those additional instances based on the example reference numbers illustrated.

The separate charging energy of the 1DTSs is exponentially suppressed by the number of channels that connect the 1DTSs to the backbone. The typical number of channels in the superconductor of half-shell nanowire realizations is expected to be larger than 1000.

The MZMs reside at the ends of the 1DTSs of length L. The remaining hybridization splitting between MZMs will be exponentially suppressed by $\exp(-L/\xi)$, where $\xi$ is the effective coherence length in the 1DTSs. Note that for a short backbone, L not only controls the hybridization within a 1DTS, but also between MZMs of different 1DTSs (for a sufficiently insulating substrate).

A two-sided Majorana Hexon qubit may comprise 1DTSs that are closely spaced in the vertical direction, but long in the horizontal direction (to minimize unwanted hybridization). (Again, the directional orientations used herein are for explanatory purposes, as the disclosed embodiments can be rotated into different orientations.) Close vertical spacing allows easy access for measurements on any two of the three nearby MZMs on a given side (left or right) of the two-sided Majorana Hexon qubit. In particular, and in some particular embodiments, a measurement scheme is employed where each of the ends of the 1DTSs can be connected to (and disconnected from) a semiconducting wire that is aligned perpendicular to the 1DTSs, as shown in schematic block diagram 300 of FIG. 3. The connection can be tuned by depletion gates. An additional set of gates can split the semiconducting, wire into separate quantum dots with full control over the coupling strength between these quantum dots. This setup therefore allows the connection of any two MZMs to coupled quantum dots. The measurement then proceeds by using the quantum clots as input and output for conductance measurements or directly probing the energy levels of the quantum dots (in the latter case also using a single dot suffices).

Figure 2:
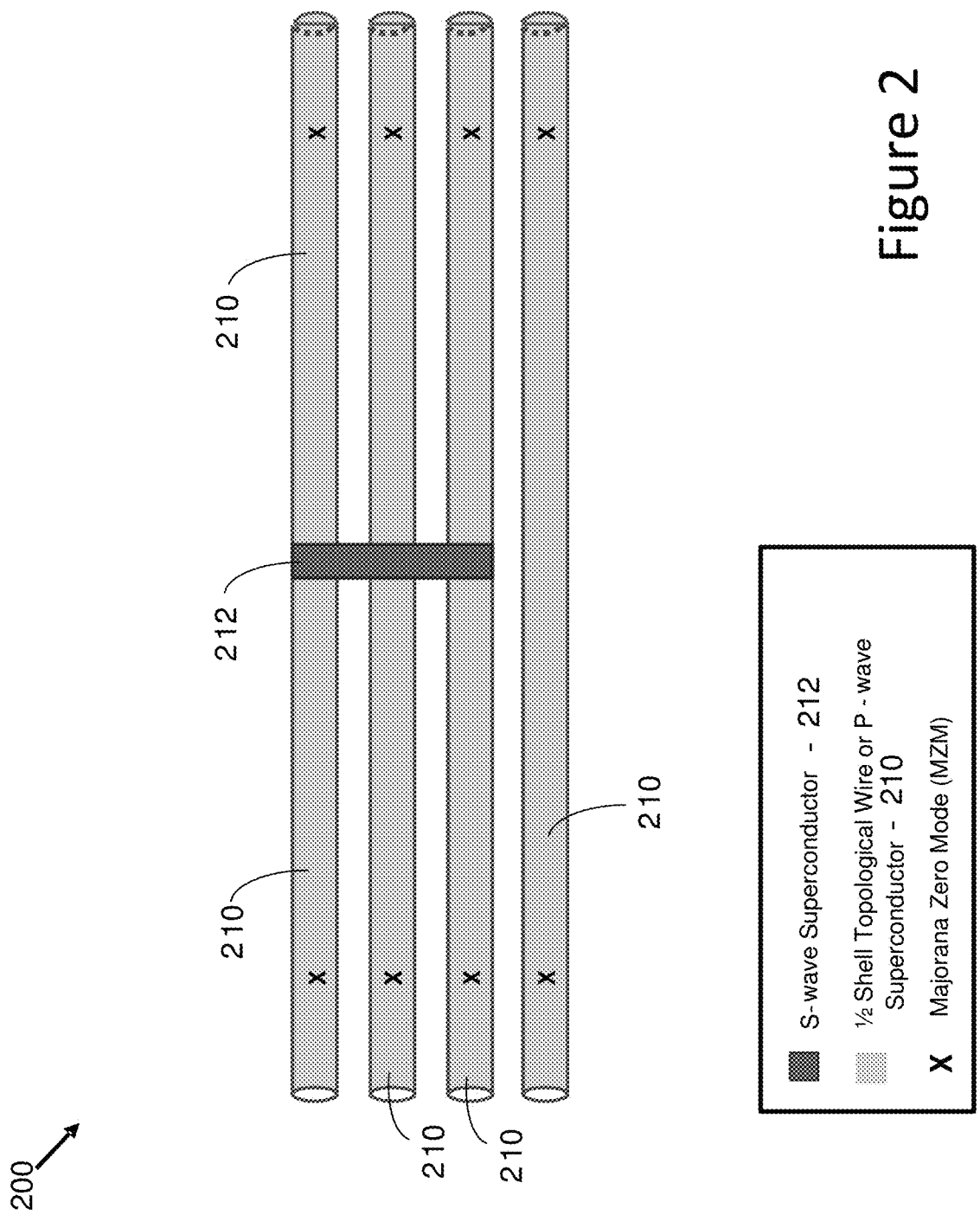
FIG. 2 is a schematic block diagram of an example two-sided Majorana Hexon cubit with a reference arm.

As mentioned above, measuring pairs within the groups of three nearby MZMs (on the left or right of the unit) is desirably complemented by measurements of pairs of MZMs selected from the opposite sides of the unit, which are separated by a distance of the order L. These long-distance measurements can be implemented by adding a coherent reference arm of length L (for example in the form of an additional, isolated 1DTS), as shown in schematic block diagram 200 in FIG. 2. When the reference arm is coupled to the vertical semiconducting wire by similar controls as the three connected 1DTSs, the flexibility of selectively coupling any of the nearby MZMs to the vertical semiconducting wire allows for performing all long-distance measurements. If the distance of the MZMs to the reference arm becomes an issue for the visibility of the measurement, it is also possible to only perform long-distance measurements involving MZMs that are at most twice the distance between neighboring 1DTSs apart from the reference arm. Note that another way of performing the long-distance measurements becomes possible if the backbone can be selectively weakened to (at least) partially disconnect one of the 1DTSs from the other two. In that case, the separate charging energy of the disconnected 1DTS splits the two fermionic parity states of the MZMs on the corresponding 1DTS, which allows for a measurement via charge sensing.

Figure 3:
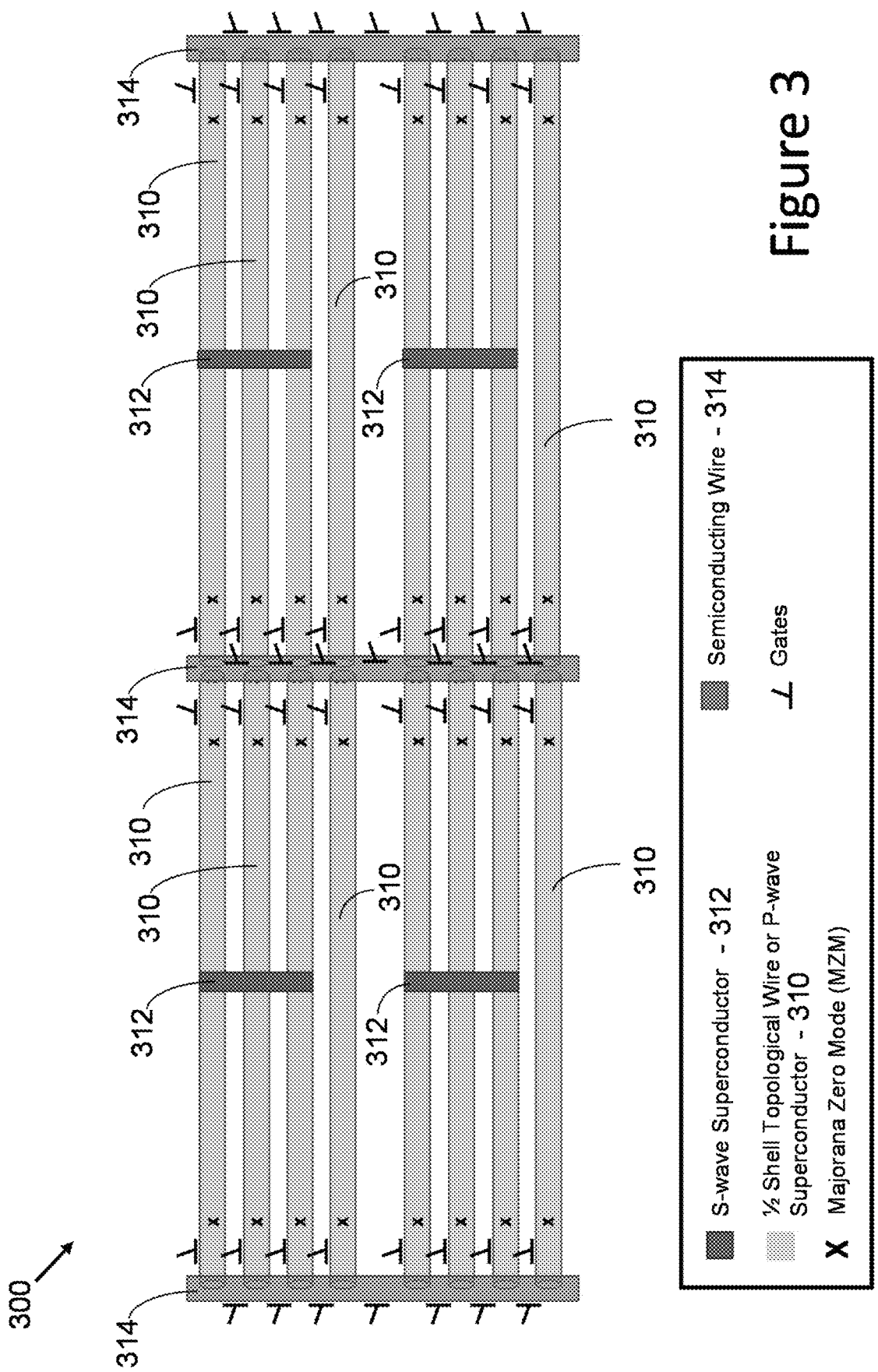
FIG. 3 is a schematic block diagram of an example network of two-sided Majorana Hexon qubits.

Entangling gates can be implemented by operations that include measurements of the joint parity of 4 MZMs, two from each qubit (on different islands). Again, these measurements are possible via conductance or spectroscopic measurements. Such 4 MZM measurements involving two horizontally adjacent two-sided Majorana Hexon qubits (denoted by left and right) can be performed by using the same vertical semiconducting wire at the right end of the left two-sided Majorana Hexon qubit and the left end of the right two-sided Majorana Hexon qubit, as seen in FIG. 3. The two dots used in the measurement would both be defined within the vertical semiconducting wire, and would be disconnected except for one hybridization path through MZMs of the left Hexon qubit and another through MZMs of the right Hexon qubit. A 4 MZM measurement involving two vertically adjacent two-sided Majorana Hexon qubits (denoted upper and lower) can be performed by making the vertical semiconducting wire extended such that the upper and lower two-sided Majorana Hexon qubits share an uninterrupted part of the semiconducting wire. One of the dots used in the measurement would then be defined on the left shared vertical semiconducting wire, while the other is on the right shared vertical semiconducting wire. For these measurements, extra reference arms would be disconnected from the two-sided Majorana Hexon qubits so that the two measured qubits can only hybridize via the upper or lower MZM states.

V. One-Sided Majorana Hexon Qubit

Figure 4:
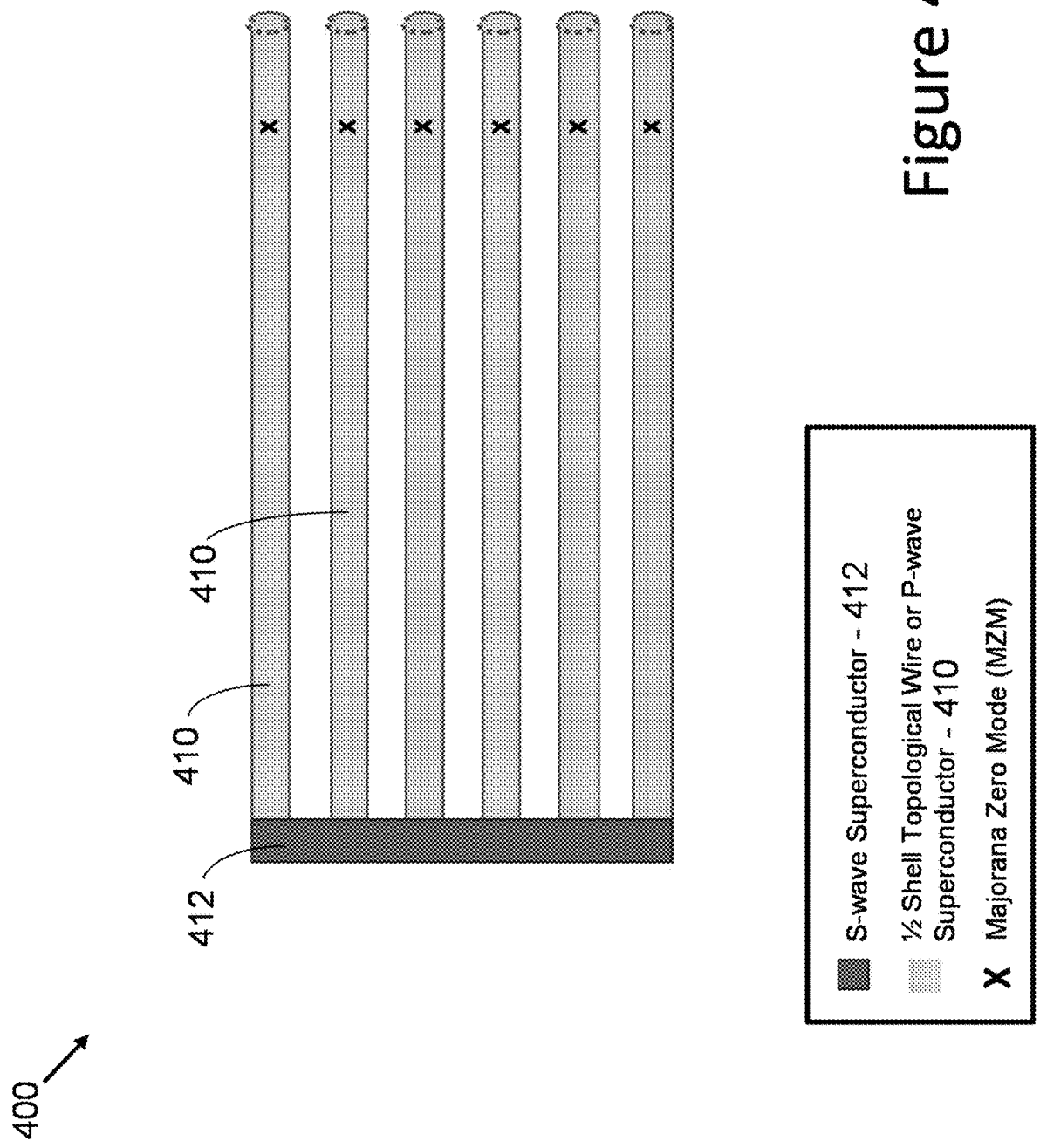
FIG. 4 is a schematic block diagram of an example one-sided Majorana Hexon qubit.

An example one-sided Majorana Hexon qubit comprises 6 1DTSs (of length L) that are connected by a superconducting backbone at one side (backbone side). FIG. 4 is a schematic block diagram 400 illustrating this example one-sided Majorana Hexon qubit. The short vertical distance between neighboring 1DTS can lead to a strong hybridization of the 6 MZMs located at the backbone side of the 1DTSs, effectively leaving only 6 MZMs at the other side (MZM side). One advantage of this design over the two-sided Majorana Hexon qubit is that it provides topological protection of the MZMs corresponding to length 2L, rather than L, for 1DTSs of length L. Since the capacitance of wires (with length much larger than the diameter) grows linearly with length, but only logarithmically with diameter, it is estimated that in the elongated design of Majorana Hexon qubits, the capacitance will be decreased when the islands are made half as long, while doubling the width. The one-sided Majorana Hexon qubit is therefore a way to increase the charging energy of the 6-Majorana islands (which increases the protection from quasiparticle poisoning).

Aside from possible changes in the overall charging energy of each island, operations for one-sided Majorana Hexon qubits can be implemented in a very similar manner as for the two-sided Majorana Hexon qubits. The Majorana side of the island is again connected to a vertical semiconducting wire that can be gated into quantum dots with tunable connections of the resulting quantum dots to the 6 MZMs. Since all 6 MZMs are now located at the same side, there are no long distances of the order of L between any pair of MZMs. This allows one to measure the joint fermionic parity of any pair of the 6 MZMs (similar to the situation for the three MZMs at each side of the two-sided Majorana Hexon qubit), without the need of a long (length of order L) reference arm.

Figure 5:
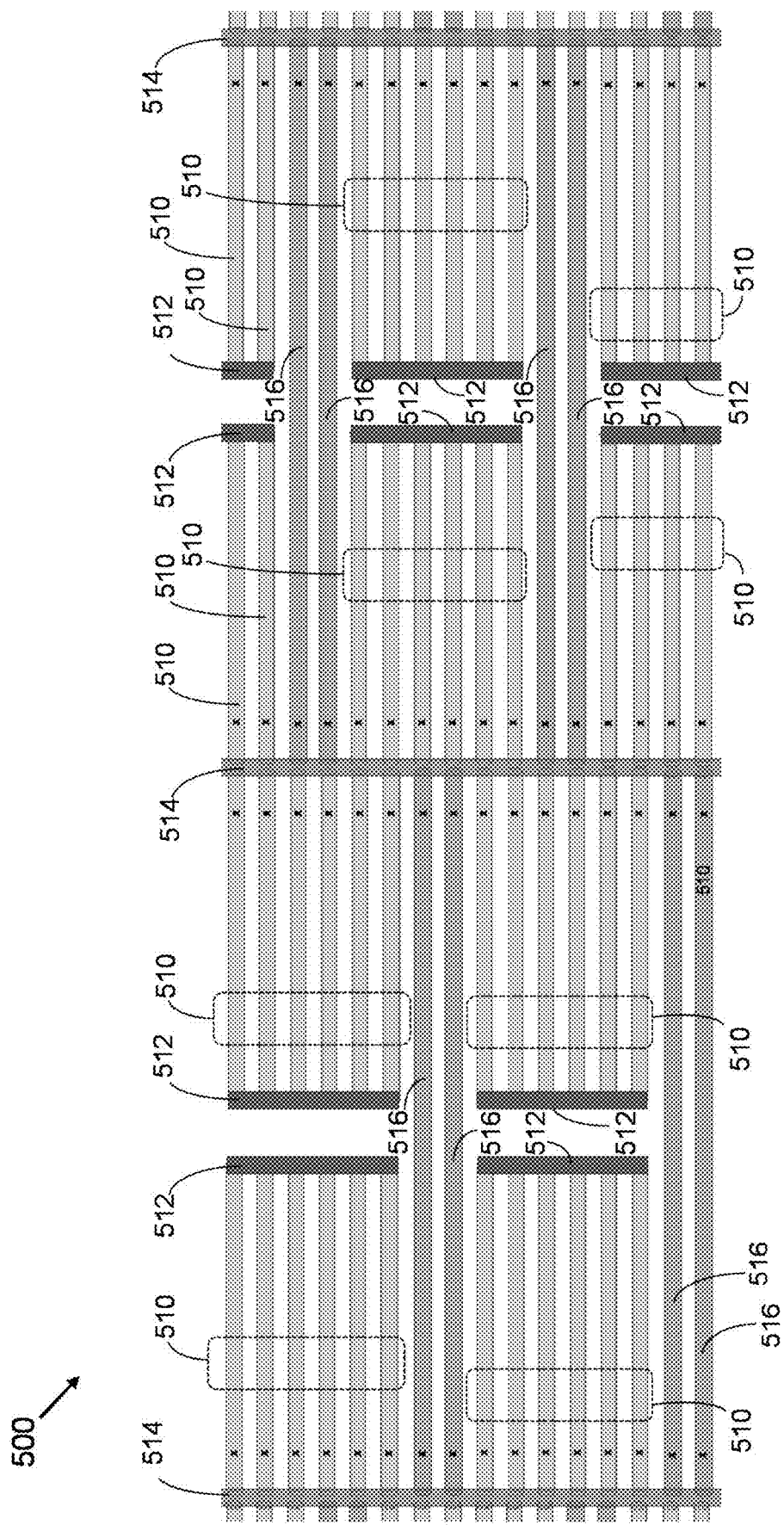
FIG. 5 is a schematic block diagram of an example network of one-sided Majorana Hexon qubits.
Figure 6:
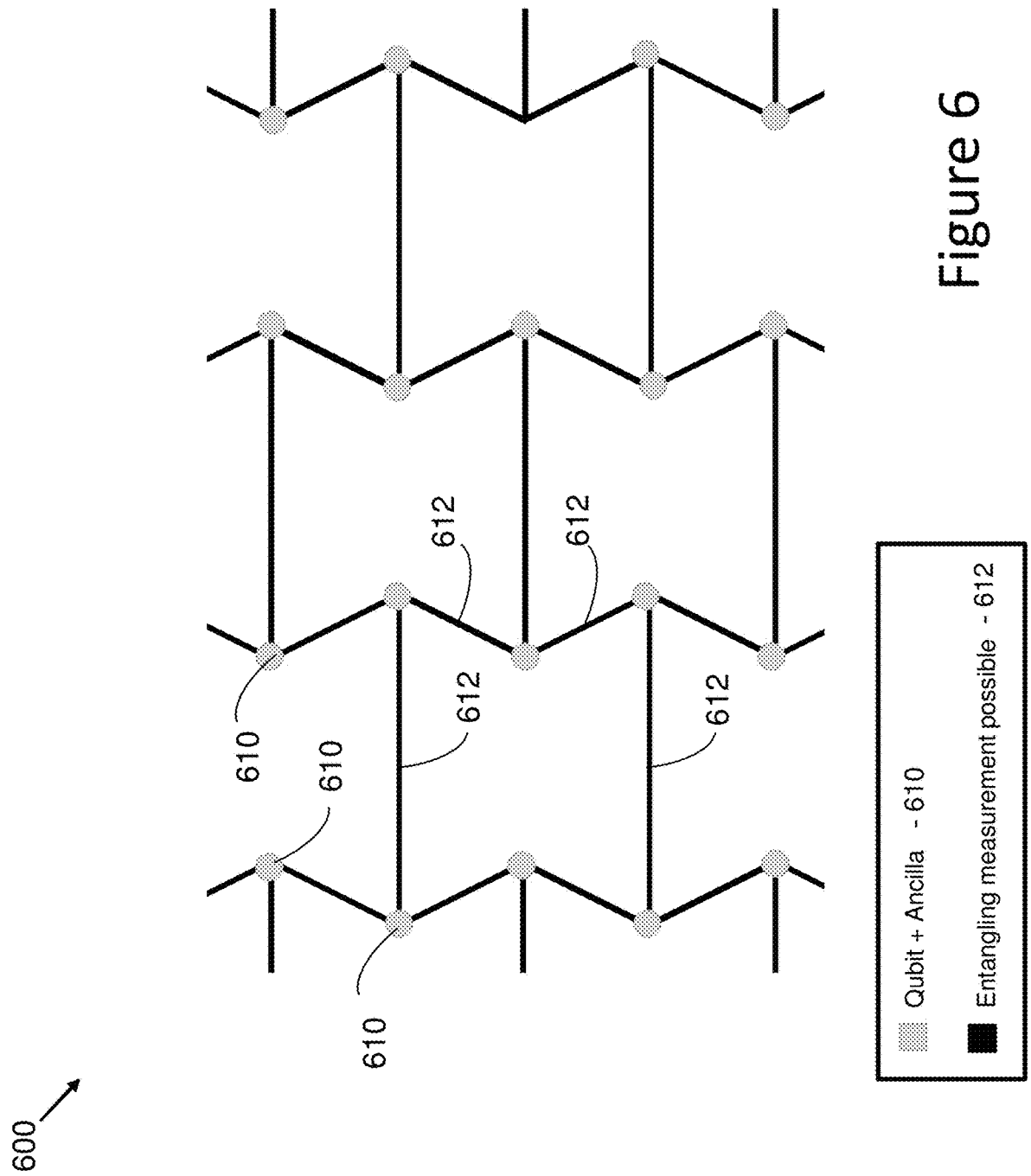
FIG. 6 is a schematic block diagram showing symmetry of an example one-sided Majorana Hexon qubit layout.

An example network of one-sided Majorana Hexon qubits can comprise pairs of one-sided Majorana Hexon qubits (one-sided pairs) aligned at the backbone side, with the Majorana side of the left one-sided Majorana Hexon qubit being on the left and the Majorana side of the right one-sided Majorana Hexon Qubit being on the right. In one particular embodiment, one reference arm of length 2L is located above and below a one-sided pair, as shown in schematic block diagram 500 of FIG. 5. This structure can then be repeated in the vertical direction, forming a vertical column in the array. The adjacent vertical columns can be vertically displaced by 4 1DTSs, as shown in FIG. 5. This way, the right part of the one-sided pair can connect (via the upper two MZMs) to the lower two MZMs of a one-sided. Majorana Hexon qubit in the adjacent vertical column. Similarly, the lower two MZMs can connect to the upper two MZMs of a one-sided Majorana Hexon qubit in the adjacent vertical column. These connections allow operations (e.g., joint parity measurements of 4 MZMs) that entangle the right part of each column with the left part of the next column. In order to also allow connections between the right and left part of each vertical column, the above mentioned extra reference arms can be used. The latter connect the right part of a one-sided pair with the left part of the one-sided pair of the next-to-nearest column (at the same horizontal position). The right and the left parts of the jth column are now connected to each other through their respective connections to the left part of the j+1th column and the right part of the j-1th column, which are in turn connected to each other (see FIG. 5). Thus, a fully connected array can be constructed, as shown in FIG. 5 and in schematic block diagram 600 in FIG. 6.

VI. Linear Majorana Hexon Qubit

Figure 7:
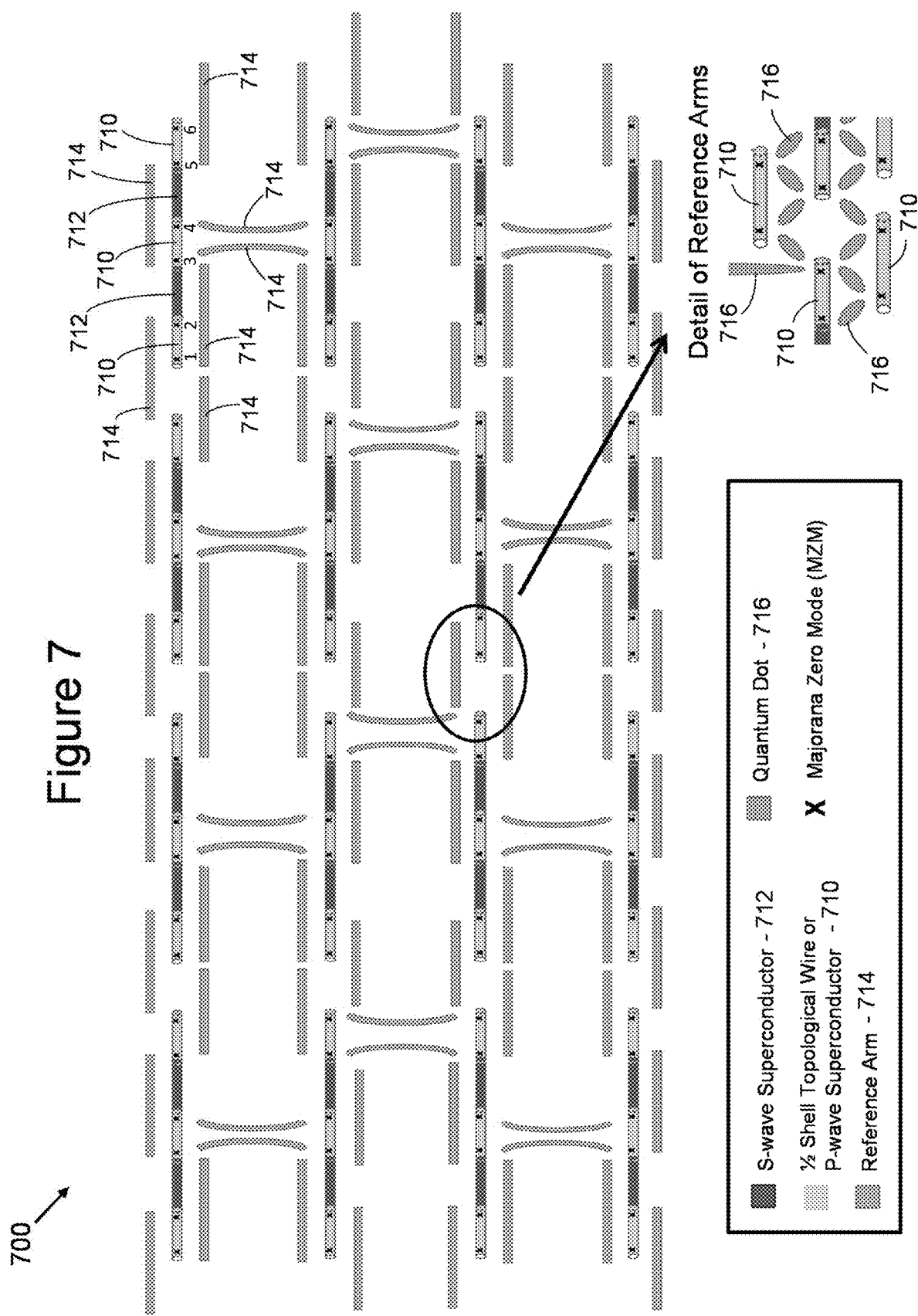
FIG. 7 is a schematic block diagram showing an example network of linear Majorana Hexon qubits.

An example linear Majorana Hexon qubit comprises one long 1DTS (length L) that is partitioned into three topological superconducting regions separated by two normal non-topological (s-wave) superconducting regions. FIG. 7 is a schematic block diagram 700 illustrating an example of a network of linear Majorana Hexons. The non-topological superconducting regions can be created from a long 1DTS by gating. Since gating does not affect the superconducting part, the superconducting "backbone" is naturally provided by the normal regions of the IDTS that connect the three topological superconducting regions, effectively forming a one-dimensional island. (In a realization of half-shell wires, the superconducting backbone would be the superconducting shell that is present throughout the entire half shell wire of length L.) In order for the system to realize MZMs at the end of the topological superconducting regions, the Lengths $L_{top}$ of the topological superconducting regions as well as the lengths $L_{normal}$ of the normal superconducting regions are desirably sufficiently long as compared with the respective coherence lengths of these regions. e.g. $L_{top} \gg \xi_{top}$ and $L_{normal} \gg \xi_{normal}$. Assuming $\xi_{top} \approx \xi_{normal}$ and $L_{region} = L_{top} \approx L_{normal}$, so that the overall length of the one-dimensional island is $L=5L_{region}$, this configuration provides topological protection of the MZMs corresponding to $L_{region}=L/5$. From similar arguments as in the previous section, the charging energy of linear Majorana Hexon qubits is smaller than both the two-sided and one-sided versions of Majorana Hexon qubits. A possible advantage of the linear Majorana Hexon qubit design is the absence of an additional structure to provide the superconducting backbone.

Due to the linear layout of this design, there are no MZM pairs that separated by at least $L_{top}$ or $L_{normal}$. In this sense, measurements cannot be performed by coupling nearby MZMs, as was used in the previous designs. Instead, all measurements require reference arms of sufficient length. One example layout, shown in FIG. 7, uses reference arms of length $L_{top}+L_{normal}$. The configuration of reference arms shown in FIG. 7 allows one to measure the joint parity of the following pairs of the MZMs on a given Hexon unit, labeled 1 to 6 from left to right: (1, 2), (1, 3), (2, 3), (3, 4), (3, 5), and (4, 5). Additionally, the configuration of reference arms allows one to measure the joint parity of the group of 4 MZMs composed of: (L5, L6, R1, R2) for two horizontally adjacent linear Majorana Hexon qubits (L and R indicating the left and right unit, respectively); and either (U5, U6, D5, D6) or (U3, U4, D3, D4) for two vertically adjacent linear Majorana. Hexon qubits (U and D indicating the upper and lower unit, respectively), depending on which rows of the array the qubits are in. These operations are sufficient to perform all Clifford operations, as outlined in the "Appendix—Hexon Details" section below.

VII. Quantum Computing Device Design Considerations

In the sections above, several designs for assembling the different types of Majorana Hexon qubits into scalable quantum computing devices were disclosed. In general, these designs comprise periodic arrays of the superconducting islands hosting 6 MZMs, together with quantum dots and reference arms that can be used to perform the desired measurements and operations on states of MZMs. The presented designs all have reasonable fabrication requirements, but they lie in different areas of design "parameter space," so the different designs may afford different advantages, e.g. in terms of fabrication and/or device characteristics and operation.

One parameter to consider is the charging energy $E_c$ of superconducting island. Charging energy is a geometric quantity that is roughly inversely proportional to the length scale L of the object, e.g. $E_c \sim 1/L$. It also is affected by the local electrical environment. $E_c$ is desirably selected to balance two opposing criteria: it should be large enough to suppress quasiparticle poisoning, which may take the form of stray electrons entering the system through a MZM; and it should be small enough that read-out signals of the measurements essential to the desired manipulation of the system are strong, enough. Per U.S. Provisional Application No. 62/378,218, the quantum dot energy shifts playing a role in measurements are proportional to $1/E_c$. Other measurement protocols show a scaling $1/(E_c)^2$. In either case $E_c$ cannot be too large or the required signal will not be detectable in a short period of time (e.g. computer clock cycle). The designs disclosed herein have length scales ranging over a factor of approximately 5. The design "Linear Majorana Hexon Qubit" has the smallest, next is the "2-Sided Majorana Hexon Qubit," and largest is the "One-Sided Majorana Hexon Qubit." Other design parameters include simplicity of fabrication. In particular, the Linear Majorana Hexon Qubit has the simplicity of not requiring a strong superconducting weld (large $E_J$) joining constituent pieces. All designs can realize the Clifford gate set in an efficient manner via measurement-only methods.

The designs disclosed herein can be implemented by using well-developed building blocks in this area of microtechnology. For example, in certain embodiments, the designs can be realized by building a structure of p-wave superconducting nanowires (Majorana nanowires) on an insulating wafer and connecting MZMs hosted by these wires via quantum dots built from gated semiconductor overlying the wires and portions of the wafer. Wires of the required p-wave type were described in Nature Nanotechnology 10, 232 (2015) [arXiv: 1411.6255] and Nature Materials 14, 400 (2015) [arXiv: 1411.6254]. The example designs use MZMs that can be localized either at the ends of wires or in middle regions, where they may be created by gating an internal segment of the wire so it is tuned out of the topological regime, e.g. as described in Nature Physics 7, 412 (2011) [arXiv: 1006.4395]. However, the general principles of the disclosed technology and the particular designs illustrated are not limited to this style of fabrication. For example, it is also possible to fabricate our layouts by gating two dimensional electron gasses (2DEGs) and proximitizing them with a superconductor, as described in Phys. Rev. B 93, 155402 (2016) [arXiv: 1511.01127]. All fabrication methods of these designs are considered to be within the scope of the disclosed technology.

VIII. Further Representative Embodiments

This section describes various example representative embodiments of the disclosed technology. These embodiments should not be construed as limiting, as they can be modified in arrangement and detail without departing from the principles of the disclosed technology.

The disclosed embodiment include embodiments of a symmetry-protected-topological and quasiparticle-poisoning-protected Majorana Hexon qubit.

For instance, one example embodiment as described herein is a two-sided Majorana Hexon qubit, comprising: three topological superconducting nanowires, each of the topological superconducting nanowires having a respective first end at which a respective first Majorana zero mode resides and a respective second end, opposite the first respective end, where a respective second Majorana zero mode resides; and a superconducting backbone element connected to the three topological superconducting nanowires, the superconducting backbone element being located between the respective first ends and the respective second ends of the three topological superconductive nanowires. In some implementations, the three topological superconducting nanowires are located on a superconducting island having a charging energy sufficient to prevent quasiparticle poisoning.

In some examples, the superconducting backbone element is oriented transverse to the three topological superconducting nanowires. In further examples, the three topological superconducting nanowires are half-shell topological wires or p-wave superconductors, and wherein the superconducting backbone element is an s-wave superconductor.

In some examples, the two-sided Majorana Hexon qubit further comprises a fourth topological superconducting nanowire selectively coupled to the respective first ends of the three topological superconducting nanowires and having a second end selectively coupled to the respective second ends of the three topological superconducting nanowires. In such embodiments, the first end of the fourth topological superconducting nanowire can be selectively coupled to the respective first ends of the three topological superconducting nanowires via a first-end semiconductive wire, and the second end of the fourth topological superconducting nanowire can be selectively coupled to the respective second ends of the three topological superconducting nanowires via a second-end semiconductive wire.

In further examples, the two-sided Majorana Hexon qubit of can further comprise a set of first-end depletion gates arranged to provide selective quantum-dot couplings between the fourth topological superconducting nanowire and any one or more of the first ends of the three topological superconducting nanowires via the first-end semiconductive wire; and a set of second-end depletion gates arranged to provide selective quantum-dot couplings between the fourth topological superconducting nanowire and any one or more of the second ends of the three topological superconducting nanowires via the second-end semiconductive wire.

Further embodiments comprise a network comprising multiple instances of any of the two-sided Majorana Hexon qubits disclosed. In such embodiments, at least one of the first-end semiconductive wire or the second-end semiconductive wire can be shared with one or more neighboring instances of the two-sided Majorana Hexon qubit. For instance, the one or more neighboring instances of the two-sided Majorana Hexon qubit can be neighboring, along a horizontal direction, a vertical direction, or both.

Another example embodiment as described herein is a one-sided Majorana Hexon qubit, comprising: six topological superconducting nanowires, each of the topological superconducting nanowires having a respective Majorana-zero-mode (MZM) end at which a respective first MZM resides and a respective backbone end opposite the MZM end; and a superconducting backbone element connected to the six topological superconducting nanowires, the superconducting backbone element being connected to the six topological superconducting nanowire at the respective backbone ends of the six topological superconductive nanowires.

In some examples, the superconducting backbone element is oriented transverse to the six topological superconducting nanowires. In further examples, the six topological superconducting nanowires are half-shell topological wires or p-wave superconductors, and the superconducting backbone element is an s-wave superconductor. In certain examples, the six topological superconducting nanowires are located on a superconducting island having a charging energy sufficient to prevent quasiparticle poisoning.

Further embodiments comprise a network comprising multiple instances of any of the one-sided Majorana Hexon qubits as described above. In some embodiments, a first instance and a second instance of the one-sided Majorana Hexon qubits are arranged such that their respective superconducting backbone elements face one another and their respective six MZM ends are in opposite directions from one another. In such embodiments, the network can further comprise a first reference-arm topological superconducting nanowire having a first end selectively coupled to each of the respective MZM ends of the first instance of the one-sided Majorana Hexon qubit and having a second end selectively coupled to each of the respective MZM ends of the second instance of the one-sided Majorana hexon qubit. Still further, some example implementations further comprise a second reference-arm topological superconducting nanowire having a first end selectively coupled to each of the respective MZM ends of the first instance of the one-sided Majorana Hexon qubit and having a second end selectively coupled to each of the respective MZM ends of the second instance of the one-sided Majorana Hexon qubit, the second reference-arm topological superconducting nanowire being located on an opposite side of the first instance and the second instance of the one-side Majorana Hexon qubit than the first reference-arm topological superconducting nanowire.

In some examples, the first end of the first reference-arm topological superconducting nanowire is selectively coupled to each of the respective MZM ends of the stance of the one-sided Majorana Hexon qubit via a first-end semiconductive wire, and the second end of the first reference-arm topological superconducting nanowire is selectively coupled to each of the respective MZM ends of the second instance of the one-sided Majorana Hexon qubit via a second-end semiconductive wire. In such examples, the network can further comprise a set of first-end depletion gates arranged to provide a selective quantum-dot coupling between the first end of the first reference-arm topological superconducting nanowire and any one or more of the MZM ends of the first instance of the one-sided Majorana Hexon qubit via the first-end semiconductive wire; and a set of second-end depletion gates arranged to provide a selective quantum-dot coupling between the second end of the first reference-arm topological superconducting nanowire and any one or more of the MZM ends of the second instance of the one-sided Majorana Hexon qubit via the second-end semiconductive wire. In some implementations, at least one of the first-end semiconductive ware or the second-end semiconductive wire is shared with one or more neighboring instances of the one-sided Majorana Hexon qubit. For instance, the one or more neighboring instances of the one-side Majorana Hexon qubit can be neighboring along a horizontal direction, a vertical direction, or both.

Further example embodiments described herein include a linear Majorana Hexon qubit, comprising: a topological superconducting nanowire partitioned into regions, including: three MZM topological superconducting regions, each having a respective first end at which a respective first Majorana zero mode resides and a respective second end, opposite the first respective end, where a respective second Majorana zero mode resides; and two s-wave superconducting regions that separate the three MZM topological superconducting regions from one another.

In some examples, the s-wave superconducting regions are created by gating junctions between the MZM topological superconducting regions and the s-wave superconducting regions. In further examples, the topological superconducting nanowire is located on a superconducting island having a charging energy sufficient to prevent quasiparticle poisoning.

Further embodiments comprise two or more instances of the linear Majorana Hexon qubit as described above. For instance, in some example implementations, one or more neighboring instances of the linear Majorana hexon obit are selectively coupleed one another by superconductive reference arms having tunable depletion gates configured to provide quantum dot couplings between the neighboring instances. In further examples, the one or more neighboring instances of the one-side Majorana Hexon qubit are neighboring, along a horizontal direction, a vertical direction, or both.

IX. Appendix—Hexon Details

As explained herein, the full set of single-qubit Clifford gates can be generated on the computational qubit encoded in a single hexon given an appropriate minimal set of joint parity measurements of pairs of MZMs. One can diagrammatically represent the topological state of a hexon as shown in FIG. 8.

Figure 8:
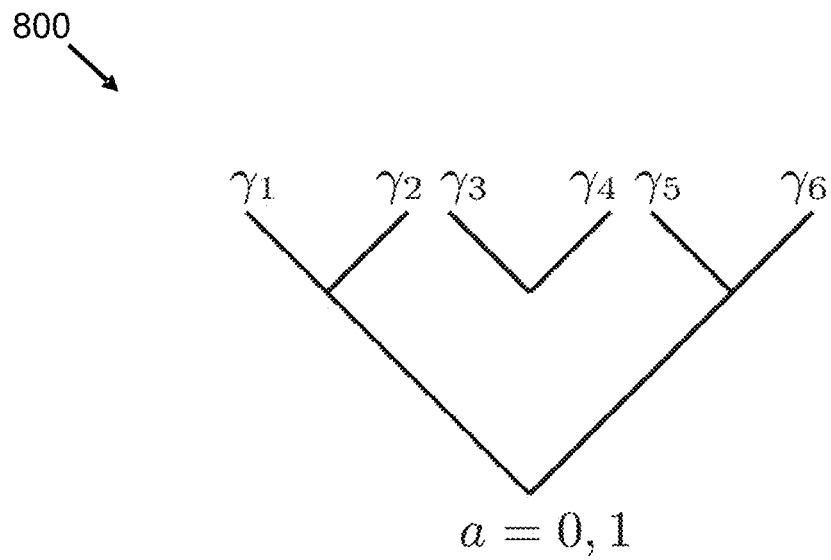
FIGS. 8-16 are diagrams illustrating further example Hexon configurations.

More specifically, FIG. 8 is a diagrammatic representation 800 of the topological states (degenerate ground states) of a hexon. The center two MZMs $\gamma_3$ and $\gamma_4$ fuse to even fermion parity, forming the ancillary pair of MZMs. The left and right pairs of MZMs both fuse to a=0 or 1, which correspond to even or odd fermion parity, respectively. These outer pairs of MZMs form the computational qubit. The fusion channel a labels the qubit basis state.

In FIG. 8, the MZMs $\gamma_j$ with j=1, . . . , 6 are labeled from left to right. The diagram may be interpreted as follows: The center two MZMs $\gamma_3$ and $\gamma_4$, forming the ancillary pair, fuse to even fermion parity ($p_{34}$=1). The left-most and the right-most pairs of MZMs, $\gamma_1$ and $\gamma_2$, and $\gamma_5$ and $\gamma_6$, respectively, forming the computational qubit, have the same fusion channel a=0 (even fermion parity) or 1 (odd fermion parity). That the fusion channel a labels the qubit basis states $$|0\rangle = |p_{12} = p_{56} = -1\rangle \tag{1}$$

$$|1\rangle = |p_{12} = p_{56} = +1\rangle \tag{2}$$

The total fusion channel of the four MZMs forming the computational qubit is even fermion parity ($p_{12}p_{56}$=1).

In this appendix, the following equation is proven:

$$\Pi_0^{(34)}\Pi_0^{(35)}\Pi_0^{(5678)}\Pi_0^{(45)}\Pi_0^{(34)} \propto W^{(5678)} \otimes \Pi_0^{(34)}, \quad (3)$$

and it is explained how to shuttle computational MZMs through the qubit. (In the following diagrammatic analysis, unimportant overall constants are neglected.)

Figure 9:
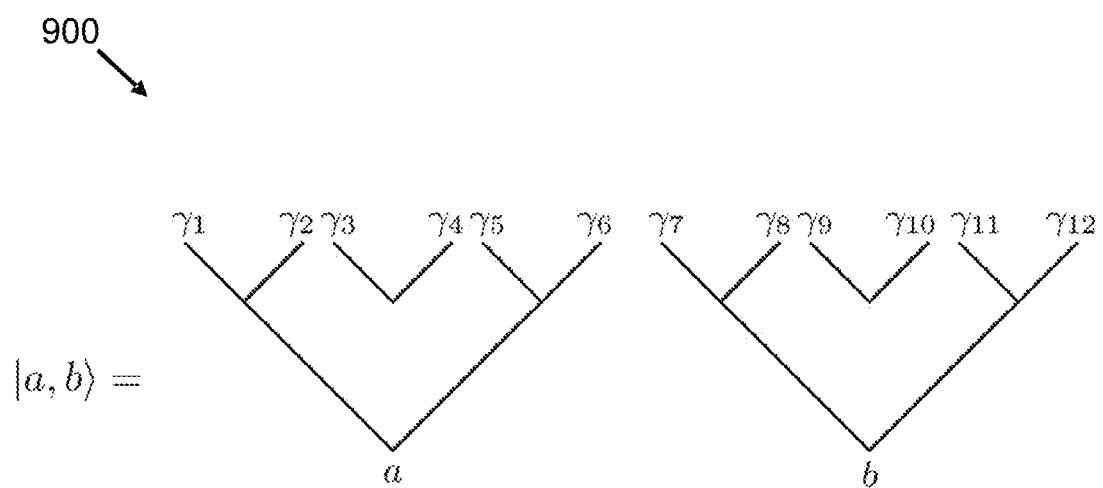

For the two-qubit entangling gate $$W = \begin{pmatrix} 1 & 0 & 0 & 0 \\ 0 & i & 0 & 0 \\ 0 & 0 & i & 0 \\ 0 & 0 & 0 & 1 \end{pmatrix}, \quad (4)$$

one begins by considering the qubit basis states of two hexons in the configurations as shown in diagram 900 of FIG. 9.

As in FIG. 8, b ε {0,1} label the fermion parity even or odd states of the outermost pairs MZMs in a given hexon.

Figure 10:
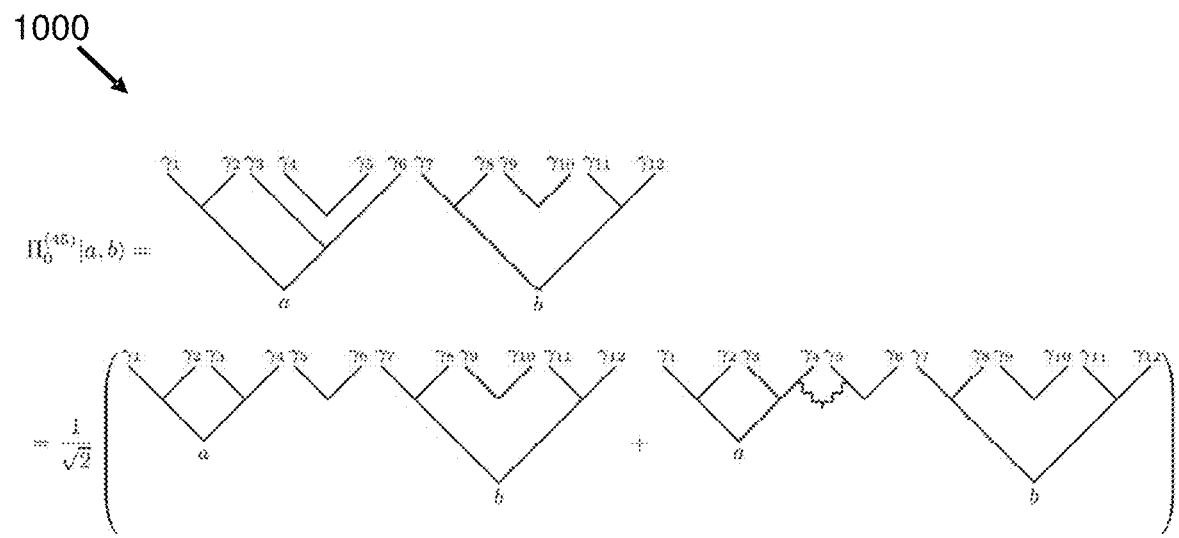
Figure 11:
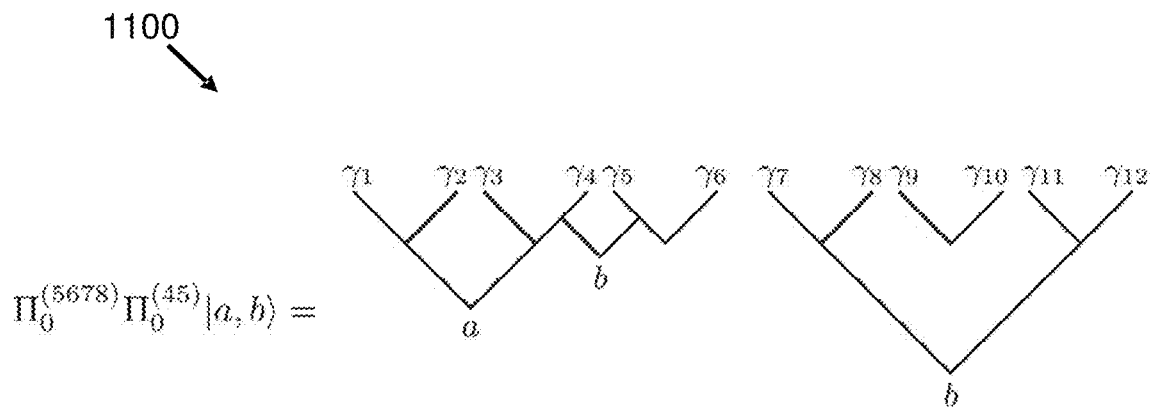
Figure 12:
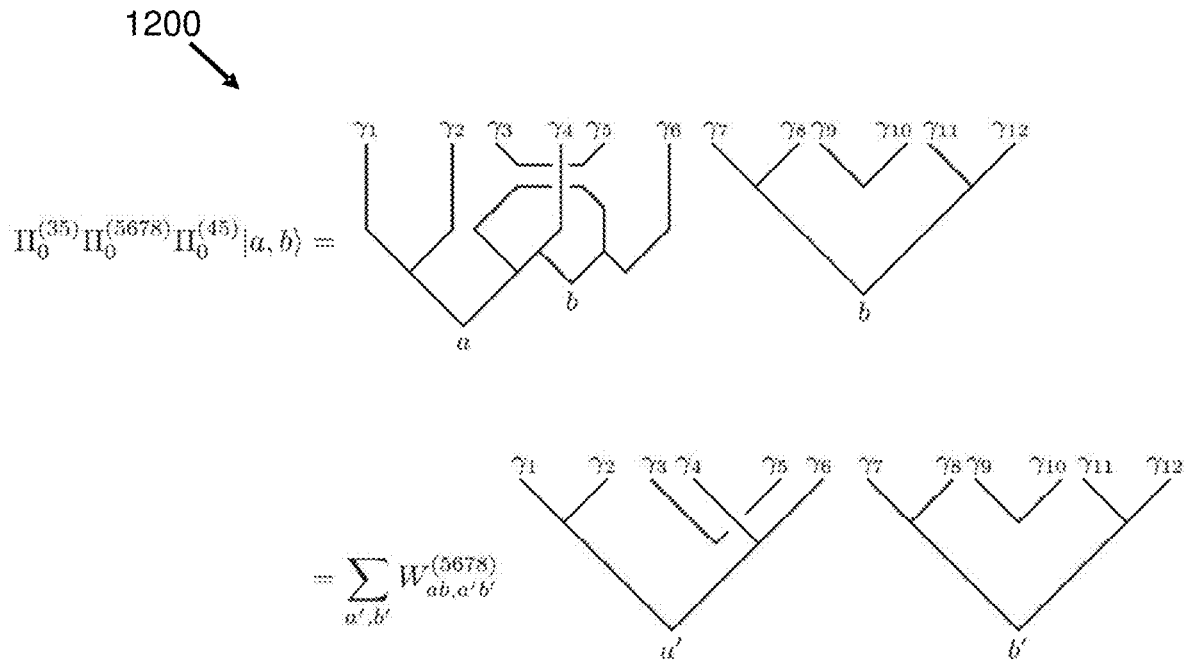
Figure 13:
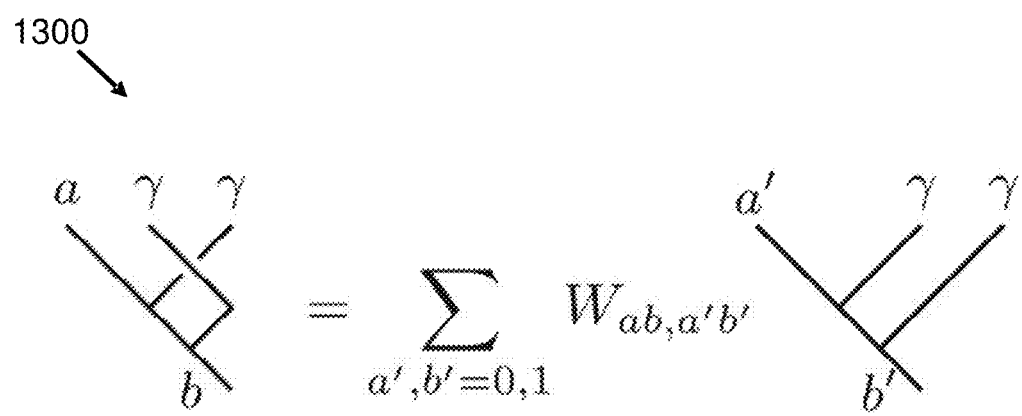
Figure 14:
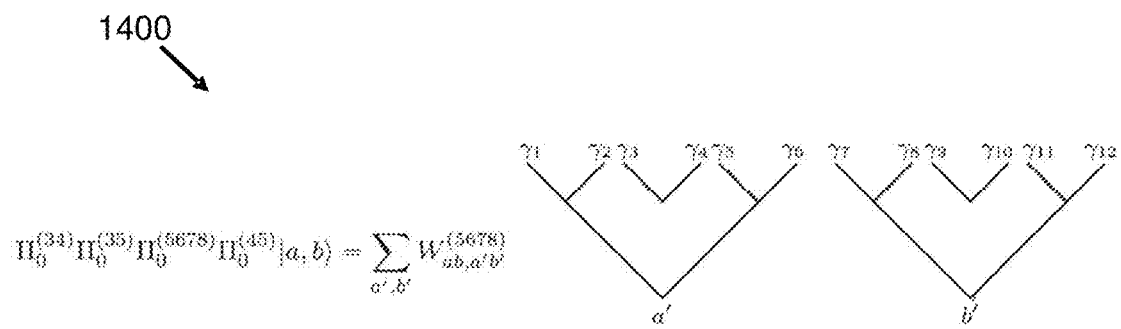

Projecting the fusion channel of MZMs 4 and 5 to vacuum (e.g., using forced measurement) results in diagram 1000 of FIG. 10, where the jagged (wiggly) line denotes fusion to a fermion.

Applying the four-MZM projector $\Pi_0^{(5678)}$ to the above superposition yields block diagram 1100 of FIG. 1100.

Then, projecting MZMs 3 and 5 to the vacuum channel gives diagram 1200 of FIG. 1200.

This step utilizes the diagrammatic braiding relation of MZMs or Ising anyons as shown in diagram 1300 of FIG. 1300.

Finally, projecting MZMs 3 and 4 to the vacuum channel gives diagram 1400 of FIG. 1400, which is the desired entangling gate.

An alternative derivation of the equation introduced in this appendix above can be performed by explicitly multiplying the projectors written in terms of Majorana operators, as follows $$\Pi_0^{(34)}\Pi_0^{(35)}\Pi_0^{(5678)}\Pi_0^{(45)}\Pi_0^{(34)} = \Pi_0^{(34)} \frac{1-i\gamma_3\gamma_5}{2} \frac{1-i\gamma_5\gamma_6\gamma_7\gamma_8}{2} \frac{1-i\gamma_4\gamma_5}{2} \Pi_0^{(34)} \quad (5)$$

$$= 2^{-3}\Pi_0^{(34)}(1 - i\gamma_3\gamma_5 - i\gamma_4\gamma_5 + \gamma_3\gamma_4 - \gamma_5\gamma_6\gamma_7\gamma_8 + i\gamma_3\gamma_6\gamma_7\gamma_8 - i\gamma_4\gamma_6\gamma_7\gamma_8 + \gamma_3\gamma_4\gamma_5\gamma_6\gamma_7\gamma_8)\Pi_0^{(34)}$$

$$= 2^{-3}(1 + \gamma_3\gamma_4 - \gamma_5\gamma_6\gamma_7\gamma_8 + \gamma_3\gamma_4\gamma_5\gamma_6\gamma_7\gamma_8)\Pi_0^{(34)}$$

$$= 2^{-3}\sqrt{2}\left(\frac{1+i}{\sqrt{2}}\right)(1 + i\gamma_5\gamma_6\gamma_7\gamma_8)\Pi_0^{(34)}$$

$$= \frac{1}{4}e^{i\pi/4}W^{(5678)} \otimes \Pi_0^{(34)}.$$

Here, $\Pi_0^{(34)} i_{\gamma_3\gamma_j}\Pi_0^{(34)} = \Pi_0^{(34)} i_{\gamma_4\gamma_j}\Pi_0^{(34)} = 0 \neq 3$ or 4 and $\Pi_0^{(34)}$ projects $i_{\gamma_3\gamma_4} = -1$.

Figure 15:
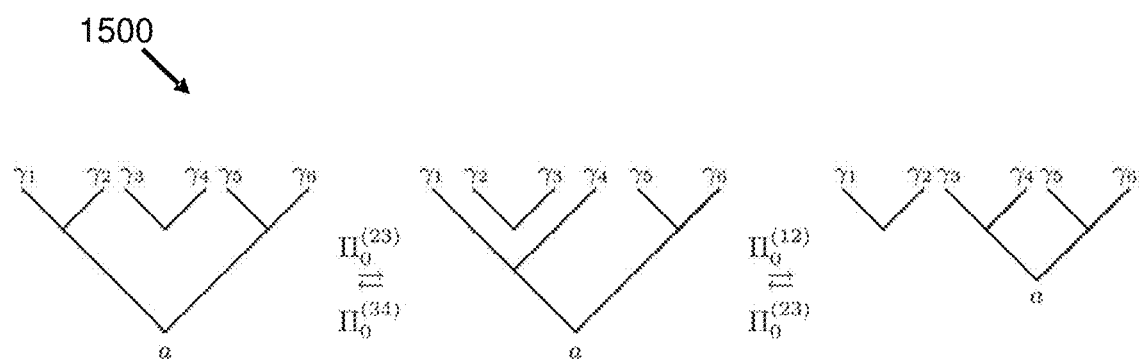
Figure 16:
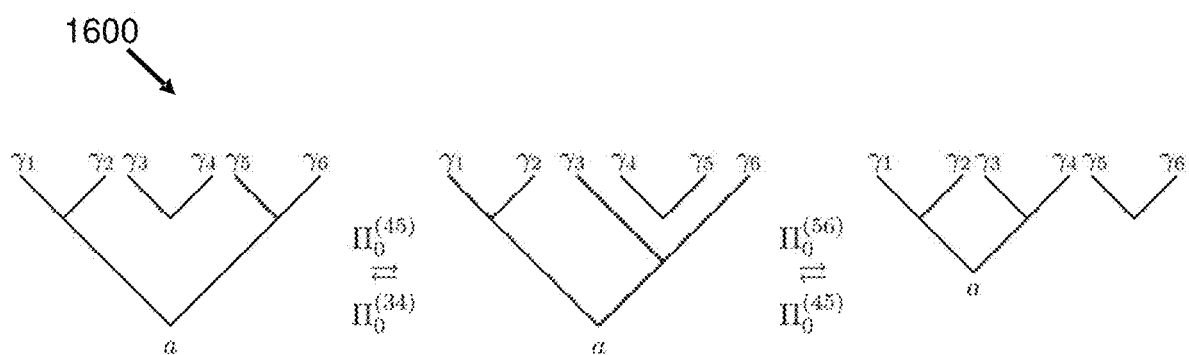

Finally, 1500 and 1600 of FIGS. 15 and 16 illustrate how the computational MZMs may be shuttled through the cubit using anyonic teleportation.

X. Concluding Remarks

Further examples and details concerning the disclosed technology, as well as other architectures with which the disclosed technology can be used, are described in T. Karzig et al., "Scalable Designs for Quasiparticle-Poisoning-Protected Topological Quantum Computation with Majorana Zero Modes," arXiv:1610.05289 (March 2017) and T. Karzig et al., "Scalable Designs for Quasiparticle-Poisoning-Protected Topological Quantum Computation with Majorana Zero Modes," Phys. Rev. B 95, 235305 (2017), both of which are hereby incorporated herein by reference.

Having described and illustrated the principles of the disclosed technology with reference to the illustrated embodiments, it will be recognized that the illustrated embodiments can be modified in arrangement and detail without departing from such principles. In view of the many possible embodiments to which the principles of the disclosed invention may be applied, it should be recognized that the illustrated embodiments are only preferred examples of the invention and should not be taken as limiting the scope of the invention.

What is claimed is:

1. A one-sided Majorana Hexon qubit, comprising:
    six topological superconducting nanowires, each of the topological superconducting nanowires having a respective Majorana-zero-mode (MZM) end at which a respective first MZM resides and a respective backbone end opposite the MZM end; and
    a superconducting backbone element connected to the six topological superconducting nanowires, the superconducting backbone element being connected to the six topological superconducting nanowires at the respective backbone ends of the six topological superconducting nanowires.

2. The one-sided Majorana Hexon qubit of claim 1, wherein the superconducting backbone element is oriented transverse to the six topological superconducting nanowires.

3. The one-sided Majorana Hexon qubit of claim 1,
    wherein the six topological superconducting nanowires are half-shell topological wires or p-wave superconductors, and
    wherein the superconducting backbone element is an s-wave superconductor.

4. The one-sided Majorana Hexon qubit of claim 1, wherein the six topological superconducting nanowires are located on a superconducting island having a charging energy sufficient to prevent quasiparticle poisoning.

5. A network comprising multiple instances of the one-sided Majorana Hexon qubit of claim 1,
    wherein a first instance and a second instance of the one-sided Majorana Hexon qubits are arranged such that their respective superconducting backbone elements face one another and their respective six MZM ends are in opposite directions from one another,
    and wherein the network further comprises a first reference-arm topological superconducting nanowire having a first end selectively coupled to each of the respective MZM ends of the first instance of the one-sided Majorana Hexon qubit and having a second end selectively coupled to each of the respective MZM ends of the second instance of the one-sided Majorana hexon qubit.

6. The network of claim 5, further comprising a second reference-arm topological superconducting nanowire having a first end selectively coupled to each of the respective MZM ends of the first instance of the one-sided Majorana Hexon qubit and having a second end selectively coupled to each of the respective MZM ends of the second instance of the one-sided Majorana hexon qubit,
    the second reference-arm topological superconducting nanowire being located on an opposite side of the first instance and the second instance of the one-side Majorana Hexon qubit than the first reference-arm topological superconducting nanowire.

7. The network of claim 5,
wherein the first end of the first reference-arm topological superconducting nanowire is selectively coupled to each of the respective MZM ends of the first instance of the one-sided Majorana Hexon qubit via a first-end semiconductive wire, and
wherein the second end of the first reference-arm topological superconducting nanowire is selectively coupled to each of the respective MZM ends of the second instance of the one-sided Majorana Hexon qubit via a second-end semiconductive wire.

8. The network of claim 7, further comprising:
a set of first-end depletion gates arranged to provide a selective quantum-dot coupling between the first end of the first reference-arm topological superconducting nanowire and any one or more of the MZM ends of the first instance of the one-sided Majorana Hexon qubit via the first-end semiconductive wire; and
a set of second-end depletion gates arranged to provide a selective quantum-dot coupling between the second end of the first reference-arm topological superconducting nanowire and any one or more of the MZM ends of the second instance of the one-sided Majorana Hexon qubit via the second-end semiconductive wire.

9. The network of claim 8,
wherein at least one of the first-end semiconductive wire or the second-end semiconductive wire is shared with one or more neighboring instances of the one-sided Majorana Hexon qubit,
wherein the one or more neighboring instances of the one-side Majorana Hexon qubit are neighboring along a horizontal direction, a vertical direction, or both.

* * * * *